US012597463B2

(12) United States Patent
Dongaonkar et al.

(10) Patent No.: US 12,597,463 B2
(45) Date of Patent: Apr. 7, 2026

(54) TECHNIQUES TO MAP AND ACCESS COLUMN READ ENABLED MEMORY

(71) Applicant: Intel Corporation, Santa Clara, CA (US)

(72) Inventors: Sourabh Dongaonkar, Portland, OR (US); Chetan Chauhan, Folsom, CA (US); Jawad B. Khan, Portland, OR (US); Rajesh Sundaram, Folsom, CA (US); Sandeep K. Guliani, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 721 days.

(21) Appl. No.: 17/824,808

(22) Filed: May 25, 2022

(65) Prior Publication Data

US 2022/0284948 A1 Sep. 8, 2022

(51) Int. Cl.
| | |
|---|---|
| *G11C 7/22* | (2006.01) |
| *G11C 11/406* | (2006.01) |
| *G11C 11/4097* | (2006.01) |
| *G11C 8/18* | (2006.01) |
| *G11C 11/4076* | (2006.01) |

(52) U.S. Cl.
CPC ........... *G11C 11/4097* (2013.01); *G11C 7/22* (2013.01); *G11C 11/40603* (2013.01); *G11C 8/18* (2013.01); *G11C 11/4076* (2013.01)

(58) Field of Classification Search
CPC . G11C 11/4097; G11C 11/40603; G11C 7/22; G11C 11/406; G11C 11/4087; G11C 11/4076
See application file for complete search history.

(56) References Cited

U.S. PATENT DOCUMENTS

| | | | |
|---|---|---|---|
| 4,983,958 A | 1/1991 | Carrick | |
| 7,620,792 B2 | 11/2009 | Maupin | |
| 11,416,170 B2 | 8/2022 | Khan et al. | |
| 2012/0286551 A1 | 11/2012 | Kumazawa | |
| 2016/0188230 A1 | 6/2016 | Blaettler et al. | |
| 2018/0039416 A1 | 2/2018 | Ware et al. | |
| 2019/0146717 A1* | 5/2019 | Khan | G06F 12/0646 |
| | | | 711/154 |
| 2019/0171576 A1 | 6/2019 | Malshe et al. | |
| 2020/0301825 A1* | 9/2020 | Chauhan | G06F 12/0207 |

(Continued)

OTHER PUBLICATIONS

Notice of Allowance for U.S. Appl. No. 17/468,210, Mailed Oct. 25, 2024, 9 pages.

(Continued)

*Primary Examiner* — Mushfique Siddique
(74) *Attorney, Agent, or Firm* — Compass IP Law PC

(57) ABSTRACT

Column read enabled three dimensional cross-point memory is optimized to reduce delay time due to partition busy times incurred when reading from a same partition. A column read enabled memory media stores each entry of a logical column of an array of bits in contiguous different physical rows and different physical columns of the cross-point memory array than any other entry of the logical column. Subsets of the contiguous different physical rows are stored in different partitions to reduce the delay time incurred when performing column reads from a same partition to improve media management operation performance.

13 Claims, 9 Drawing Sheets

(56) References Cited

U.S. PATENT DOCUMENTS

| 2020/0301828 A1* | 9/2020 | Khan | ................. | G06F 12/0238 |
| 2021/0407564 A1* | 12/2021 | Dongaonkar | ........ | G11C 13/004 |

OTHER PUBLICATIONS

A. Neale and M. Sachdev, "A New SEC-DED Error Correction Code Subclass for Adjacent MBU Tolerance in Embedded Memory," IEEE Transactions on Device and Materials Reliability, vol. 13, No. 1, Mar. 2013, 8 Pages.
Advisory Action for U.S. Appl. No. 16/249,964, Mailed Sep. 7, 2021, 3 pages.
Final Office Action for U.S. Appl. No. 16/249,964, Mailed Jun. 24, 2021, 21 pages.
First Office Action for U.S. Appl. No. 16/249,964, Mailed Mar. 4, 2021, 12 pages.
Notice of Allowance for U.S. Appl. No. 16/249,964, Mailed Mar. 30, 2022, 9 pages.
Second Office Action for U.S. Appl. No. 16/249,964, Mailed Oct. 4, 2021, 23 pages.

* cited by examiner

300 – Example Layout with address offsets without partition offsets

FIG. 3

400 – Example Mapping of Input Partition to Partition Offset and Actual Partition

| Input Partition on shared Command Address Bus | Partition Offset Programmed | Actual Partition on Optane Media |
|---|---|---|
| Optane Media Die 0 | 0 | x |
| Optane Media Die 1 | 1 | (x+1) % MAX_PARTITIONS |
| Optane Media Die 2 | 2 | (x+2) % MAX_PARTITIONS |
| Optane Media Die 3 | 3 | (x+3) % MAX_PARTITIONS |

500 – Example Layout with combined address offsets and partition offsets

FIG. 5

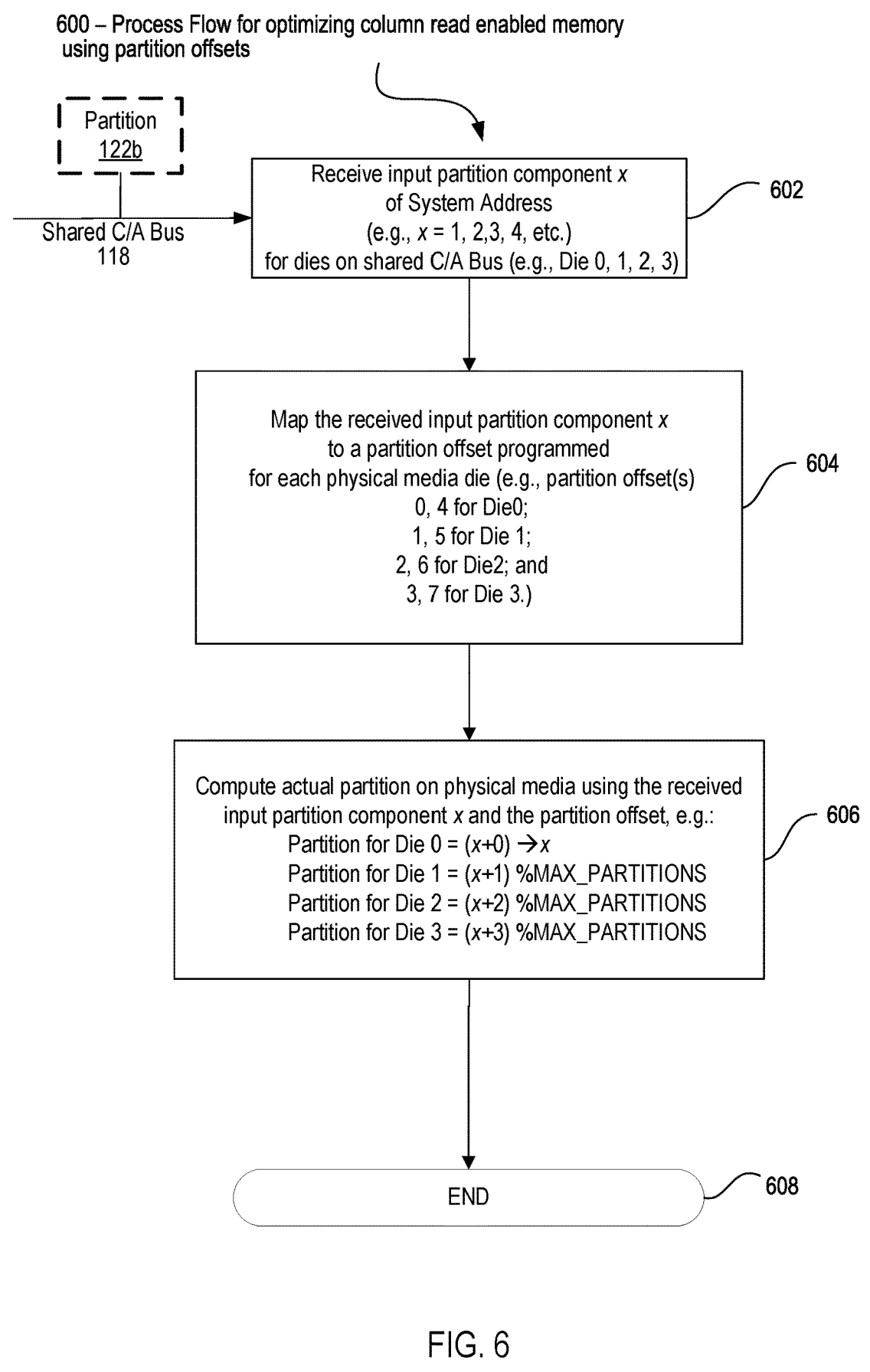

600 – Process Flow for optimizing column read enabled memory using partition offsets Partition
122b Shared C/A Bus
118

Receive input partition component $x$
of System Address
(e.g., $x$ = 1, 2,3, 4, etc.)
for dies on shared C/A Bus (e.g., Die 0, 1, 2, 3)       ∼ 602

Map the received input partition component $x$
to a partition offset programmed
for each physical media die (e.g., partition offset(s)
0, 4 for Die0;
1, 5 for Die 1;
2, 6 for Die2; and
3, 7 for Die 3.)       ∼ 604

Compute actual partition on physical media using the received
input partition component $x$ and the partition offset, e.g.:
Partition for Die 0 = ($x$+0) →$x$
Partition for Die 1 = ($x$+1) %MAX_PARTITIONS
Partition for Die 2 = ($x$+2) %MAX_PARTITIONS
Partition for Die 3 = ($x$+3) %MAX_PARTITIONS       ∼ 606

END       ∼ 608

FIG. 6

700 – Process Flow for column read (write) with partition offset
for column read enabled memory

800

112/120 MEMORY MEDIA /
CROSS-POINT MEMORY
ARRAY

TECHNIQUES TO MAP AND ACCESS COLUMN READ ENABLED MEMORY

FIELD

This disclosure relates to a memory accessible by row and/or by column and in particular to improving performance of memory devices enabling column reads of data stored in the memory.

BACKGROUND

In matrix multiplication or matrix addition operations, data is manipulated by a compute device in rows and columns. Matrix data is stored in memory in a row-major format or column-major format. In a row-major format, consecutive elements of the rows of the matrix are stored in contiguous physical addresses in a memory device. Conversely, in a column-major format, consecutive elements of the columns are stored in contiguous physical addresses in a memory device. A matrix multiplication operation involves reading a given matrix in row-major format, reading another matrix in column-major format, and multiplying the respective rows and columns with one another.

An object recognition system for an artificial intelligence application may analyze thousands of images of objects stored in a memory so that it can learn to find visual patterns in an image to identify an object. The volume of data used in large-scale similarity searches is an extremely challenging problem that is both compute and memory intensive.

Memory that can be accessed by rows and/or by columns can allow for faster performance of processes such as similarity search, databases, and genomic analysis, among others.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 3 illustrates an example of an array of bits stored in multi-bit wide logical columns arranged across different physical rows and columns in a three dimensional cross-point memory die without partition offsets;

FIG. 5 illustrates an example of an array of bits stored in multi-bit wide logical columns arranged across different physical rows and columns in a plurality of three dimensional cross-point memory die with partition offsets in accordance with various examples described herein;

FIG. 6 is a process diagram illustrating a method for programming partition offsets for column read enabled memory in accordance with various examples described herein;

Figure 1:
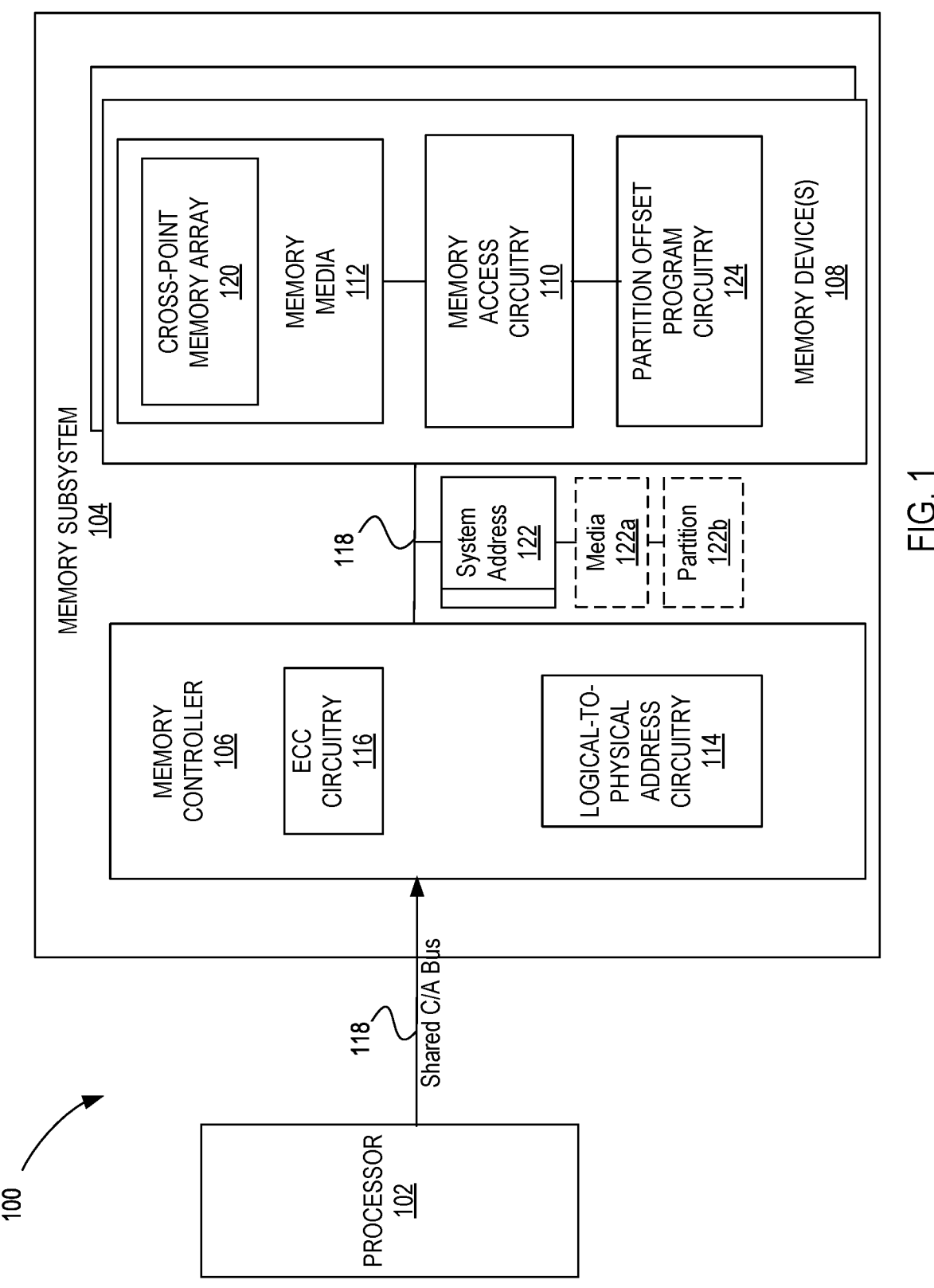
FIG. 1 is a block diagram of a compute device having a memory subsystem in which embodiments of a partition offset feature optimizes performance of column read enabled memory devices in accordance with various examples described herein.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DETAILED DESCRIPTION

A memory cell in a three dimensional cross-point memory can be addressed individually allowing data to be written and read on a per-bit basis. Each row of memory cells in the three dimensional cross-point memory is connected to a word line, and each column of memory cells is connected to a bit line with a memory cell located at the intersection of a word line and a bit line.

The cross-point memory can be logically partitioned into a plurality of partitions with each partition having a plurality of tiles and each tile including one or more memory cells. To perform efficient searches, database elements (for example, records, vectors, rows) are written to the cross point memory array in binary format (ones and zeros) as hash codes (sequences of values produced by a hashing function), that are sparse (have more zeros (clear bits) than ones (set bits)). The ones (set bits) encode the information and are used to search for matches. A column read can be used to read bitwise data across all of the tiles.

A delay time, which can be referred to as a Partition Busy Time, is required prior to a subsequent column-wise read to the same partition. The Partition Busy Time can be 20 times longer than the time to perform one read from a partition. The delay time is not required prior to a subsequent column-wise read from another (different) partition.

To reduce the delay time, an array of bits can be physically stored in a physical block of memory in M physical rows and M physical columns such that a one-bit wide logical column is arranged across the M physical rows and M physical columns with each bit of the one-bit wide logical column in a different physical row and physical column. Media access circuitry defines the logical rows and logical columns in which, in a given logical column (e.g., a column of a multi-dimensional matrix of data), each bit is in a different physical row and physical column than any other bit in that logical column.

By arranging the data of the logical columns as described herein, a compute device can perform memory accesses (e.g., writes and/or reads) that avoid a latency due to the above-described delay time that would otherwise occur as the memory media performs a physical state change (e.g., a cool-down process) at the physical row and column that was just accessed, before the next bit of data within that same row and/or column is accessible.

Further, to provide additional efficiency in terms of manufacturing cost and physical die size (e.g., number of logic gates), in the embodiments described herein, the logical columns can be arranged diagonally across the physical rows and columns. Arranging each logical column diagonally simplifies the mathematical operations involved in addressing the underlying physical tiles (e.g., using rotation and modulus operators), as compared to other patterns of distributing the bits in a given logical column across the underlying physical rows and columns.

In terms of overall performance and usefulness, there are drawbacks to the above-described arrangement of the data of the logical columns. For example, the one-bit wide logical column restricts the usage of logical column reads to applications where data can be encoded in bitwise fashion and bit operations can be utilized. Furthermore, M physical rows per die need to be kept physically together in a die so that the M one-bit physical columns can be arranged diagonally across the M physical rows. Moreover, as multiple dies are typically connected to the same command-address (C/A) bus, 4M rows (M rows per die) need to be kept physically together for 4 dies in parallel.

To ensure uniform wear of memory elements in the three dimensional cross-point memory, a media management operation periodically moves data within the three dimensional cross-point memory. The M physical rows and M physical columns in each of the dies must be moved together requiring 4M row reads and 4M row writes. As all of the row reads and row writes are to the same partition, the media management operation imposes a significant performance penalty due to the Partition Busy Time requirement.

To reduce the number of physical rows used to store the array of bits, the array of bits can be physically stored in multi-bit wide columns such that a multi-bit wide logical column is arranged across (M/multi-bits) physical rows and (M/multi-bits) physical columns with each of the plurality of multi-bit wide logical columns in the logical row stored in a different physical row and physical multi-bit column, such as a diagonal arrangement.

For example, if the number of bits per row is 128 and each multi-bit wide column has 8-bits (multi-bits is 8), the array of bits is stored in 16 columns (128/8) and 16 rows (128/8) in the three dimensional cross-point memory. The number of rows to store the array of bits with one bit per column is reduced from 128 to 16. In addition, the multi-bit wide column allows data types other than Boolean to be stored in the array of bits.

With multiple dies connected to the same C/A bus, a multi-bit column is read from each of dies. For example, with 4 dies connected to the C/A bus and each multi-bit column having 8 bits, 64 bits is read in parallel from the 4 dies for each column read. M rows per die need to be kept physically together for 4 dies in parallel. The number of rows to be written and kept physically together in the media is reduced by the number of bits stored in the multi-bit column, significantly simplifying the media management requirements. A key advantage of wide columns is the significantly reduced media management overhead.

The use of a multi-bit wide column allows a column Error Correction Code (ECC) to be embedded with the data written to the multi-bit wide column. By having columns multiple bits/bytes wide and columns ECC protected makes column ECC easier to implement in a system without a need of additional circuitry.

Reading multiple bits per column entry from the three dimensional cross-point memory alleviates media management challenges, and enables ECC corrected column reads for arbitrary data types. In addition, media management is simpler by reducing the number of rows that need to be written together and kept physically together, to keep the different physical row/different physical column arrangement intact.

Nevertheless, even with all of the improvement from reading multiple bits per column entry and reducing the number of rows that need to be written together and kept physically together, media management performance of media with column read enabled systems can still be approximately sixteen times (16×) worse as compared to performance of normal row reads of three dimensional cross-point memory.

For example, in typical memory architecture, each row in a media die stores 16B of data, which means 64B per row across all 4 dies connected in parallel. For media management, this data needs to be periodically refreshed. The media controller periodically refreshes the data in 1 KB blocks, which entails moving 16 rows. The media controller moves one row at a time so that, at worst, a single partition is blocked for ~100 ns (nanoseconds) (e.g., RD2RD_SAMEPART) for reading the refresh row, and another partition is blocked for ~480 ns (e.g., WR2WR_SAMEPART) for writing the row to a different partition. The media controller typically mixes in the 16 move operations with regular read/write traffic in order to minimize the impact of media management operations on memory performance.

The key challenge, however, is that this block of data must remain physically together in the media to preserve the different physical row/different physical column data arrangement. Therefore, when data needs to be moved for media management purposes, the entire block must be moved together. As this block is contained within a single partition, it requires 16 reads and 16 writes to same partition for purpose of media management.

For example, 16 reads are issued to the same partition requiring 16*RD2RD_SAMEPART=1.6 µs (microseconds), followed by 16 writes issued to another partition requiring 16*WR2WR_SAMEPART=7.68 µs. Hence the above-mentioned 16× increase in media management time in column read enabled systems, as host reads/writes to one partition will have to wait until this entire refresh operation is complete.

For column read enabled systems to be successful they must demonstrate performance that more closely matches row read performance, including media management overhead. Due to the large 16× penalty in media management time, the overall read latencies have a much wider range making the adoption of column read enabled systems difficult for end customers.

To address the above-described shortcomings of column read enabled systems, embodiments of a partition offset feature for optimizing column read enabled memory as described herein allow column read enabled data to be laid out across different partitions instead of being laid out across more addresses in a same partition. A subset of contiguous physical rows can be stored in a single partition of multiple partitions of memory using the partition offset feature. Among other advantages, storing a subset of contiguous physical rows in a single partition reduces delay time during memory management operations while still preserving the arrangement of data that enables efficient column-wise reads of data with a single read command.

Examples of an optimal layout using embodiments of the partition offset feature are described herein in which media management performance improves by as much as four times (4×) over existing column read enabled systems. The improved performance approaches row read performance and can make adoption of column read enabled systems easier for end customers.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

FIG. 1 is a block diagram of a compute device 100. The compute device 100 includes a processor 102 and a memory subsystem 104. The memory subsystem 104 can also be referred to as a memory module (such as a Dual In-line Memory Module, or DINIM). The memory subsystem 104 includes a memory controller 106 and a memory device 108 connected to a shared Command/Address (C/A) bus 118. Embodiments of the memory device 108 includes memory access circuitry 110, including a partition offset program circuitry 124, and memory media 112.

In an embodiment, the memory media 112 is a cross-point memory array 120. The memory controller 106 includes logical-to-physical (L2P) address translation circuitry 114 to convert a logical row address and a logical column address to a physical row address and a physical column address in the memory media 112 of the memory device 108. In an embodiment, the shared C/A bus 118 transports a system address 122 that has a media component 122a and a partition component 122b. The media component 122a can be used in the translation circuitry 114 and the partition component 122b can be used in the partition offset program circuitry 124. Together, the media and partition components can be used to convert to the physical row address and the physical column address in the memory media 112 of the memory device 108 to optimize column reads and improve media management performance of the memory device 108 in accordance with various examples described herein.

The memory controller circuitry 106 also includes Error Correction Code (ECC) circuitry 116. Prior to writing a matrix to the memory media 112, parity bits are generated for both the rows and columns and buffered in the memory controller 106. When the matrix level parity calculations are complete, the parity and data for the matrix are written to the memory media 112. The ECC circuitry 116 can perform error correction for a column ECC and row ECC when reading a column or row.

The memory controller 106 can be any device or circuitry to selectively read from and/or write to the memory media 112, for example, in response to requests from the processor 102, which may be executing an application seeking to read from or write to the memory media 112.

The processor 102 can be embodied as any device or circuitry (e.g., a multi-core processor(s), a microcontroller, or other processor or processing/controlling circuit) capable of performing operations described herein, such as executing an application, for example, similarity search, database searches, and matrix operations. In some embodiments, the processor 102 may be embodied as, include, or be coupled to a field-programmable gate array (FPGA), an application specific integrated circuit (ASIC), a system-on-a-chip (SoC), reconfigurable hardware or hardware circuitry, or other specialized hardware to facilitate performance of the functions described herein.

The memory controller 106 can read individual bits stored in columns in the cross-point memory array 120 for use in performing similarity searches, also referred to as "stochastic associative searches" (SAS). The memory controller 106 can access multiple cells in parallel within a given partition in the memory media 112 containing the cross-point memory array 120.

The memory media 112 can be logically partitioned into a plurality of partitions with each partition having a plurality of tiles. Each tile can include one or more cells. In an embodiment, each tile has 128 cells (bits). An example of the cross-point memory array 120 of memory media 112 is described in greater detail in FIG. 9.

In one embodiment, the partition offset program circuitry 124 of memory device 108 can program the partition offsets for each die of the memory media 112 based on input partitions received on the shared C/A bus 118. In addition, the actual partitions of the plurality of partitions into which the memory media 112 has been logically partitioned can be computed based on the maximum partitions available for the memory media 112. The input partitions can be chosen or pre-determined based on performance characteristics of the memory media 112 and/or the size of the matrix data to be stored in the memory media 112.

Figure 2:
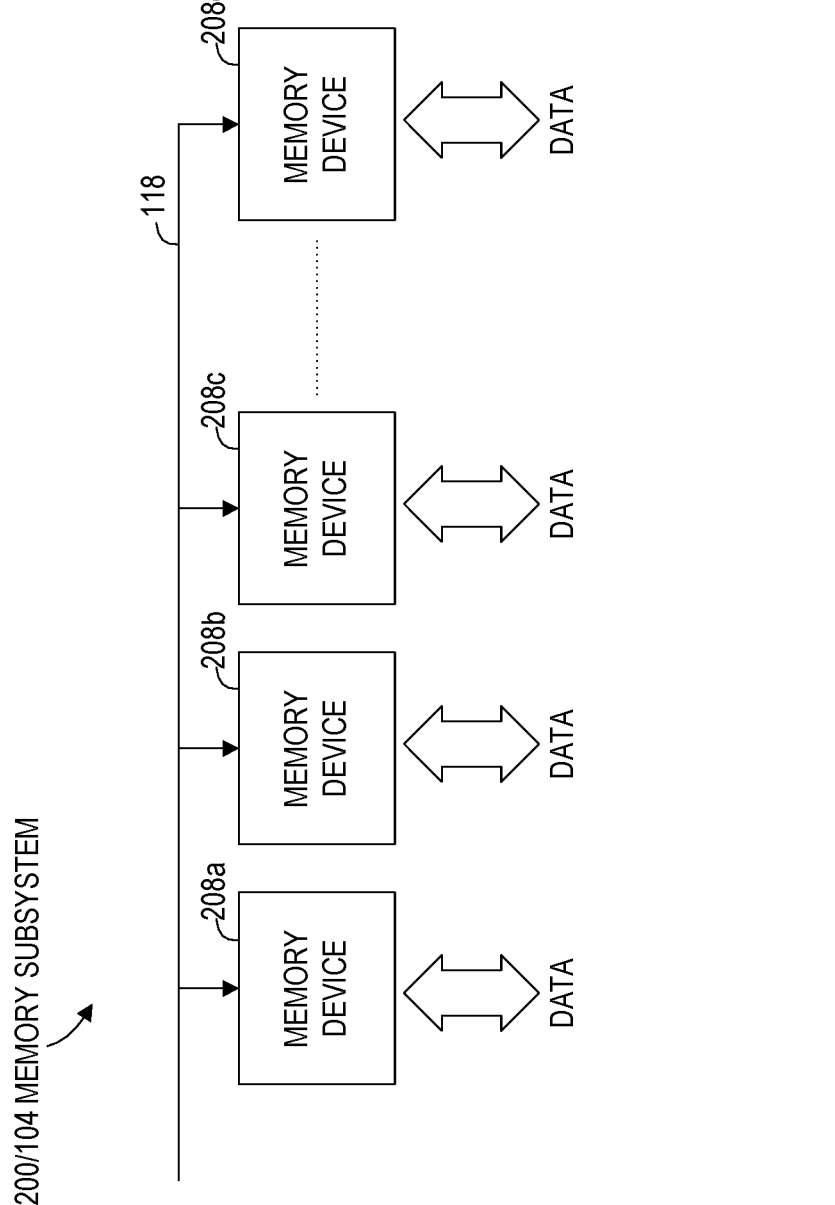
FIG. 2 is a block diagram of the memory subsystem shown in FIG. 1 that includes multiple dies of a memory device in accordance with various examples described herein.

FIG. 2 is a block diagram of the memory subsystem 200/104 that includes multiple dies 208a, 208b, 208c and 208d of the memory device 108 shown in FIG. 1. The memory subsystem 200/104 can be a Dual In-line Memory Module (DIMM). Multiple dies 208a, 208b, 208c and 208d of the cross-point memory array 120 in one or more memory devices 108 on the memory subsystem 200/104 are connected to the shared C/A bus 118. As such, in operation, data stored in the cross-point memory array 120 in the memory devices 108 on the memory subsystem 200/104 is read in parallel from the dies 208a, 208b, 208c and 208d of the cross-point memory array 120 in the memory devices 108 connected to the shared C/A bus 118. Data may be stored in the cross-point memory array 120 in a configuration to allow column-wise reading of entries in a same logical column, i.e., column reads, that are stored in each of the dies 208a, 208b, 208c and 208d of the cross-point memory array 120 in memory devices 108.

One of the memory devices 108 can be used to store row Error Correcting Code (ECC) for data stored in a row across a plurality of the dies of the cross-point memory array 120 in the memory subsystem 104. Another one of the memory devices 108 can be used to store metadata for the data stored in a row across a plurality of the dies 208a, 208b, 208c and 208d of the cross-point memory array 120 in memory devices 108 in the memory subsystem 104. In an embodiment, there are six memory devices 108 on a memory module representing memory subsystem 104, four to store data, one to store metadata and one to store row ECC.

Figure 3:
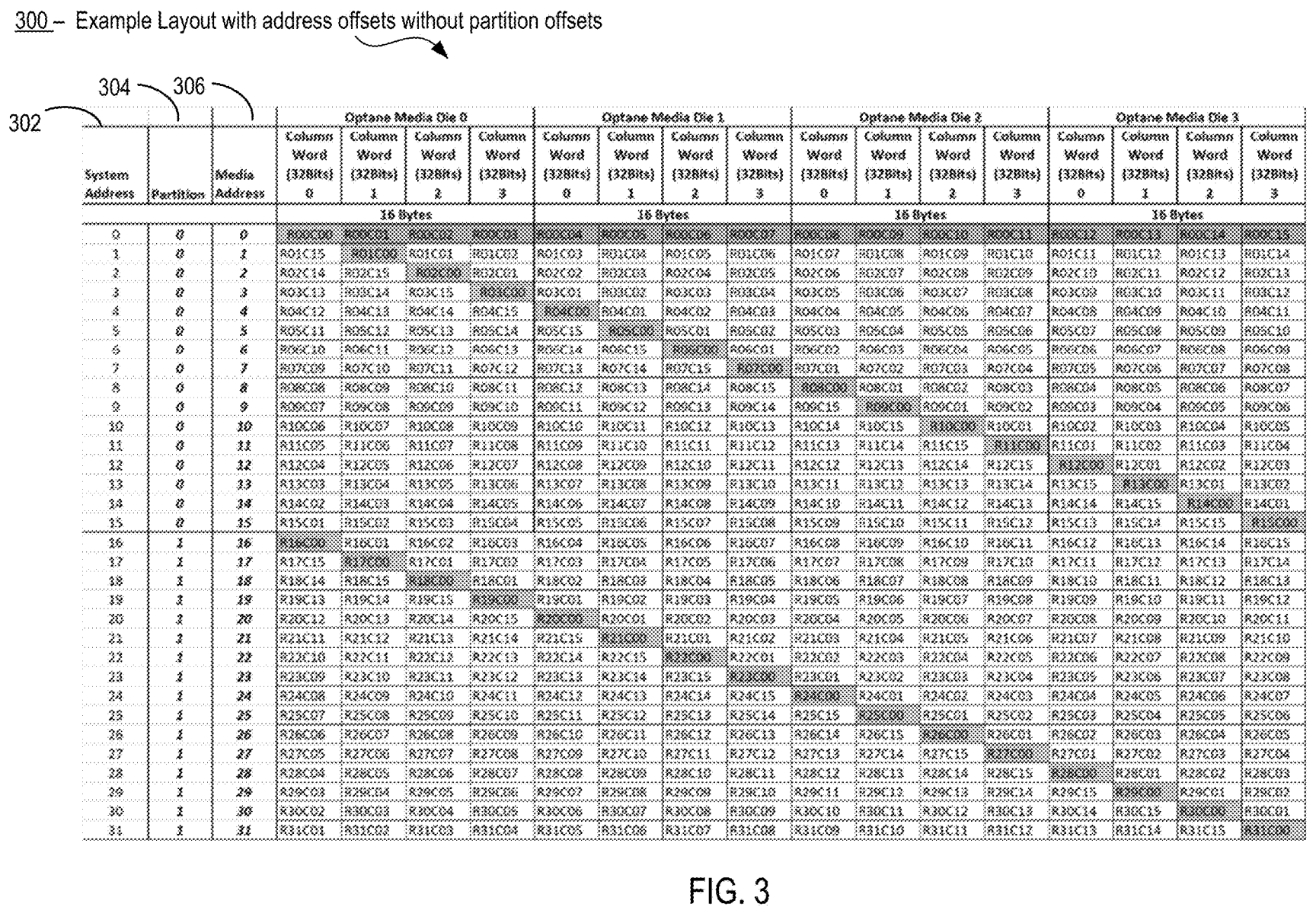

FIG. 3 illustrates an example of an array of bits stored in multi-bit wide logical columns using an address offset 306, but without the benefit of the embodiments of the partition offset feature described herein. Thus, there is only one partition 304 (e.g., no partition offsets within the array of bits) to map to the system address 302. Example data layout 300 for a 1k block of an array of bits stored in multi-bit wide logical columns illustrates how the data can be arranged across physical rows/columns in a plurality of three dimensional cross-point memory die 208a, 208b, 208c 208d, (e.g., the Optane™ Media Die 0, 1, 2 and 3).

At read time, the address offset (the media address row offset 306) is applied, so that 32 bits of data is read from each media row, but within the same partition 304. Thus, 32-bit columns across 16 rows across all four dies 0, 1, 2 and 3, in a single partition 304 (e.g., partition 0) is read column-wise with a single read command.

The number of rows that need to be written together and kept physically together in the three dimensional cross-point memory die to keep the illustrated column data arrangement intact are dependent on the number of column entries in the array of bits. The number of column entries can be increased without increasing the number of rows by storing the array of bits in multi-bit wide logical columns distributed across different physical rows/columns, typically in a diagonal arrangement to simplify mathematical operations for determining physical addresses based on address offsets.

The multi-bit wide column allows data types other than Boolean to be stored in the array of bits. Each multi-bit wide logical column has n-bits, where n is greater than one. The n-bits can be used to store n-bits of data with no parity bits, or a first portion of the n-bits can be used to store data and a second portion of the n-bits can be used to store parity. For example, n/2 bits can be used to store data and n/2 bits can be used to store parity.

To access the data efficiently using column reads, the memory controller reads 32 bits at a first address (row/column) in the first three dimensional cross-point die and increments the row and column by 1 to read the next 32 bits from the next address (row/column) in the first three dimensional cross-point die. After the 32 bits is read from the last address (row/column) in the first three dimensional cross-point die (e.g., die 0), the first address (row/column) in the second three dimensional cross-point die (e.g., die 1) is read. The last entry of the multi-bit wide logical column is stored in the last address (row/column) of the last three dimensional cross-point die (e.g., die 3).

Because all of the rows need to be written together and kept physically together in the three dimensional cross-point memory die to keep the illustrated column data arrangement intact, the impact on the media management commands to refresh and move the data to a different partition remains problematic, and the overall efficiency of the column reads is reduced due to the increase in delay times, i.e., the unavoidable Partition Busy Times incurred after reading from the same partition. In the description that follows, embodiments of a partition offset feature enables a partition offset to be programmed in the memory device(s) 108/208a, 208b, 208c, 208d to reduce delay time, thus optimizing column read enabled memory in accordance with the examples described herein.

Figure 4:
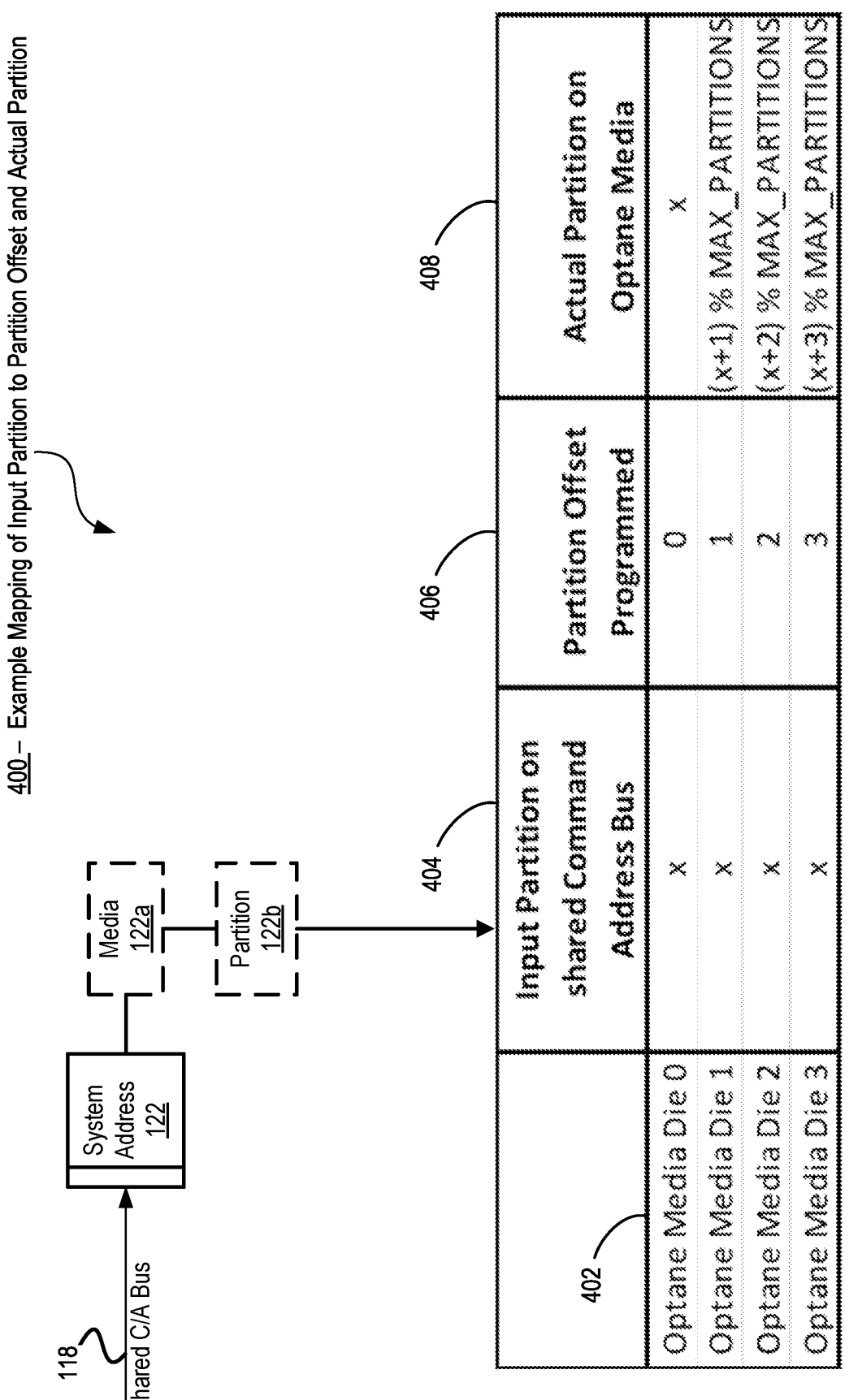
FIG. 4 illustrates an example map of an input partition to a partition offset and an actual partition in a memory device in accordance with various examples described herein.

FIG. 4 illustrates an example of a mapping 400 of an input partition 404 to a partition offset 406 and, ultimately, to an actual partition 408 on a memory media 112, in accordance with various embodiments of a partition offset feature to optimize column read enabled memory as described herein. In the illustrated example, a system address 122 received via the shared C/A bus 118 includes a media component 122a and a partition component 122b. The shared C/A bus 118 is connected to memory media 112, such as an Intel® Optane™ Memory Media 402. The partition component 122b provides the input partition x 404 on the shared C/A bus 118. The input partition x 404 is mapped by corresponding die numbers 0, 1, 2 and 3 of the memory media 112 to a partition offset 406 that can be used to determine the actual partition 408 in which a media address offset (such as the media address offset 506 in FIG. 5) is located. In one embodiment, the partition offset can be an integer, e.g., partition offset 0, 1, 2 and 3, as illustrated, or 4, 5, 6 and 7 (not shown), identifying one of the plurality of partitions into which the memory media 112 was logically partitioned.

In one embodiment, for example, the sum of the input partition x 404 and the partition offset 406 can be divided with a modulo operator by the maximum number of partitions available, e.g., % MAX PARTITIONS to produce the actual partition 408 in which a media address offset is located. The process of determining the partition offsets and actual partitions is described in further detail in the process diagram illustrated in FIG. 6.

Figure 5:
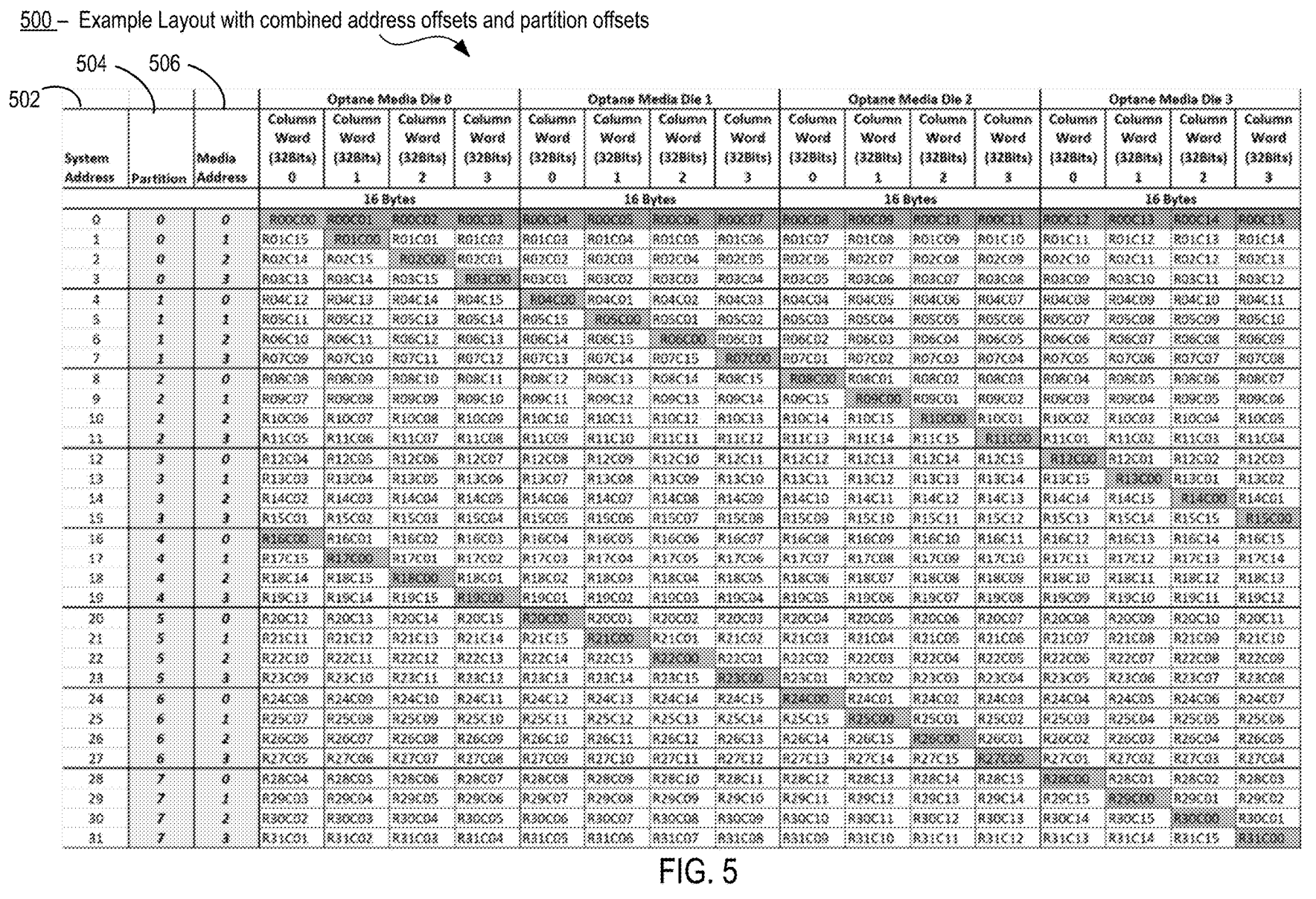

FIG. 5 illustrates an example of an array of bits stored in multi-bit wide logical columns using a combination of a media address offset 506 and a partition offset 504 to improve the overall efficiency of column reads. Note that the media address offset 506 and partition offset 504 combine to change the mapping of the system address 502 to the physical rows and columns of the memory media. Example data layout 500 for a 1k block of an array of bits stored in multi-bit wide logical columns illustrates how the data can be arranged across physical rows/columns as well as across multiple partitions (e.g., using partition offsets 0, 1, 2 and 3) in a plurality of three dimensional cross-point memory die 208a, 208b, 208c 208d, (e.g., the Optane™ Media Die 0, 1, 2 and 3).

The use of multiple partitions operates to reduce the number of rows that need to be written together and kept physically together during media management operations to keep the illustrated column-wise data arrangement intact. In the illustrated example 500, a column read is accomplished using a combination of partition offsets 504 and address offsets 506. The combination of offsets ensures that only 4 rows of the 1k block of the array of bits stored in multi-bit wide logical columns reside in a single partition. As a result, only 4 rows need to be read from a single partition to refresh the data or otherwise manage the data during media management operations.

In one embodiment, the impact on the delay time to refresh the data due to Partition Busy Time can be computed as:

$$4*RD2RD\_SAMEPART=0.4 \text{ µs delay time}$$

Likewise, the 4 rows can be written to another partition to move the data. The impact on the delay time to move the data due to Partition Busy Time can be computed as:

$$4*WR2WR\_SAMEPART=1.92 \text{ µs delay time}$$

For the example data layout 500 illustrated in FIG. 5, the above computations amount to a 4× improvement in the overall delay time because the delay time is not incurred prior to a subsequent column-wise read from a different partition. Distributing the array of bits over multiple partitions directly improves the performance of host read/writes by reducing the number of times a subsequent column-wise read is performed from a same partition, thereby eliminating at least some of the delay time.

In an embodiment, the ratio of media address offset 506 and partition offset 504 can be modified to suit design requirements. For example, one design for the example data layout illustrated in FIG. 5 uses four partition offsets (0, 1, 2 and 3) with just four rows (media address offsets 0, 1, 2 and 3) of the array of bits residing in a single partition.

Another design (not illustrated) could use as many as eight partitions with just two rows of the array of bits residing in a single partition.

FIG. 6 is a process diagram illustrating a method 600 for optimizing column read enabled memory using partition offsets in accordance with various examples described herein.

At block 602, a memory controller receives a partition component 122*b* of a system address 122 via a shared C/A bus 118. The partition component 122*b* of the system address 122 is the input partition x 404 for optimizing column read enabled memory media 112 comprising one or more dies (e.g., Die 0, 1, 2, 3) in a memory subsystem. Processing continues at block 604.

At block 604 a memory access circuitry 110 causes a partition offset program circuitry 124 to map the input partition component x to a partition offset programmed for each physical media die. In some examples, the number of partitions may equal or exceed the number of die, e.g., partition offsets 0, 4 for Die0, partition offsets 1, 5 for Die 2, and so forth. Processing continues at block 606.

At block 606 the memory access circuitry 110 causes the partition offset program circuitry 124 to compute the actual partition on physical media using a modulo operation on the maximum number of partitions, where the maximum number of partitions is pre-determined. For example, using the input partition x 404 (e.g., partition component x 122*b* of the system address 122 received via the shared C/A bus 118) and the partition offset 406, the actual partition 408 in which media address offsets are located in die 0 can be computed as (x+0) % MAX PARTITIONS, or simply x. The actual partition 408 for die 1 can be computed as (x+1) % MAX PARTITIONS, die 2 as (x+2) % MAX PARTITIONS and for die 3 as (x+3) % MAX PARTITIONS and so forth. Processing continues at block 608.

At block 608 the partition offset program circuitry 124 returns control to the memory access circuitry 110 of memory media 112.

Figure 7:
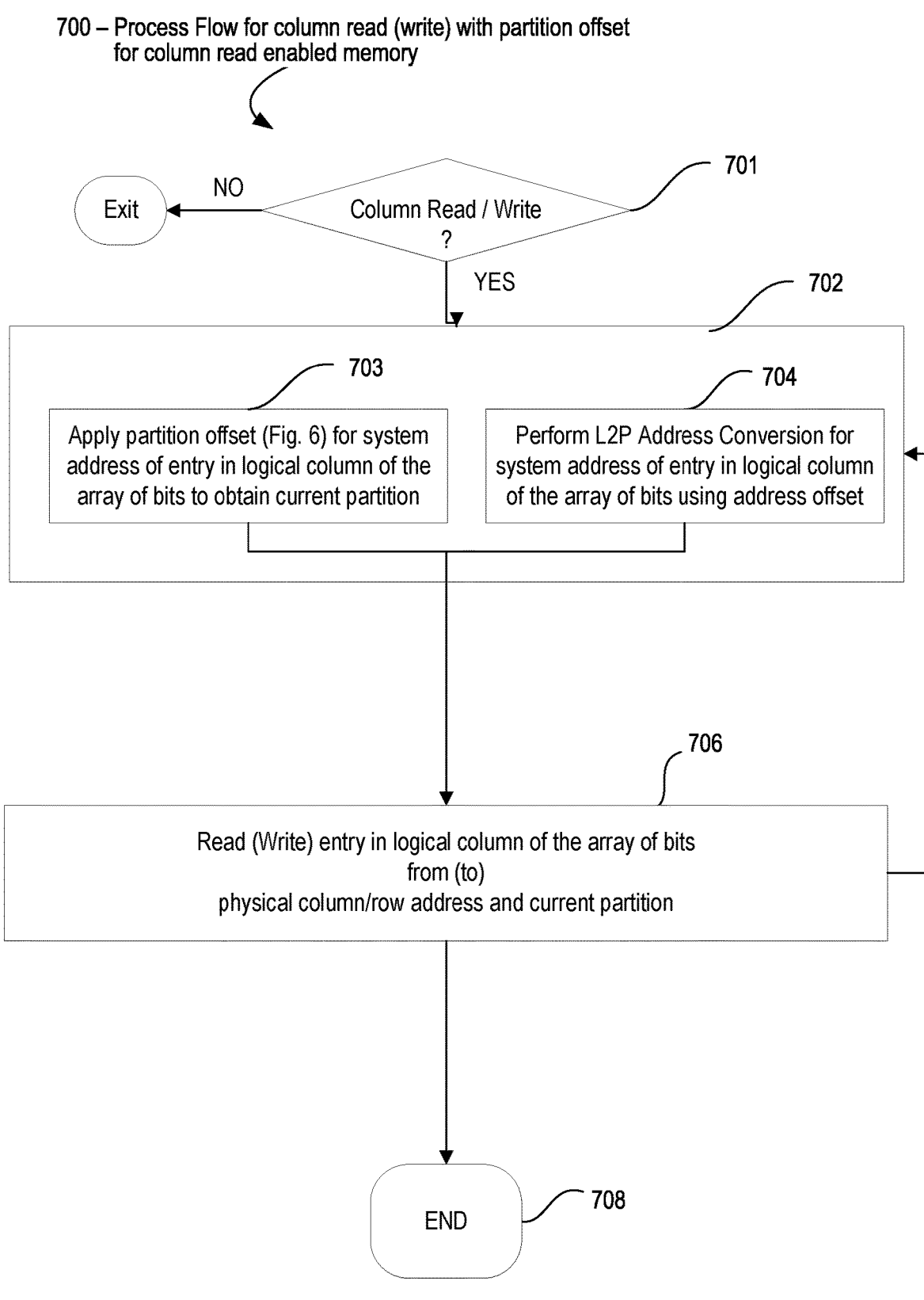
FIG. 7 is a process diagram illustrating a method for column reads and writes with partition offsets for column read enabled memory in accordance with various examples described herein.

FIG. 7 is a process diagram illustrating a method 700 for column reads and writes with partition offset for column read enabled memory in accordance with various examples described herein.

At block 701, the media access circuitry 110 determines whether a column read/write has been requested for an entry in a logical column of an array of bits. If not, the media access circuitry 110 exits. If so, processing continues at block 702.

Within block 702, the memory access circuitry performs blocks 703 and 704 in parallel. At block 703, the memory access circuitry 110 applies the input partition of the system address of the entry in the logical column of the array of bits to obtain the current partition in which the entry is to be read from or written to as described in FIG. 6. At block 704, the memory access circuitry 110 performs a logical to physical address conversion for the entry in the logical column of the array of bits using an address offset. Processing continues with block 706.

At block 706, the memory access circuitry 110 reads (or writes) the data for the entry in the logical column of the array of bits from (or to) the memory media at the physical row address and physical column address that corresponds to the current partition and address offset in the three dimensional cross-point memory die. Processing terminates at block 708.

Figure 8:
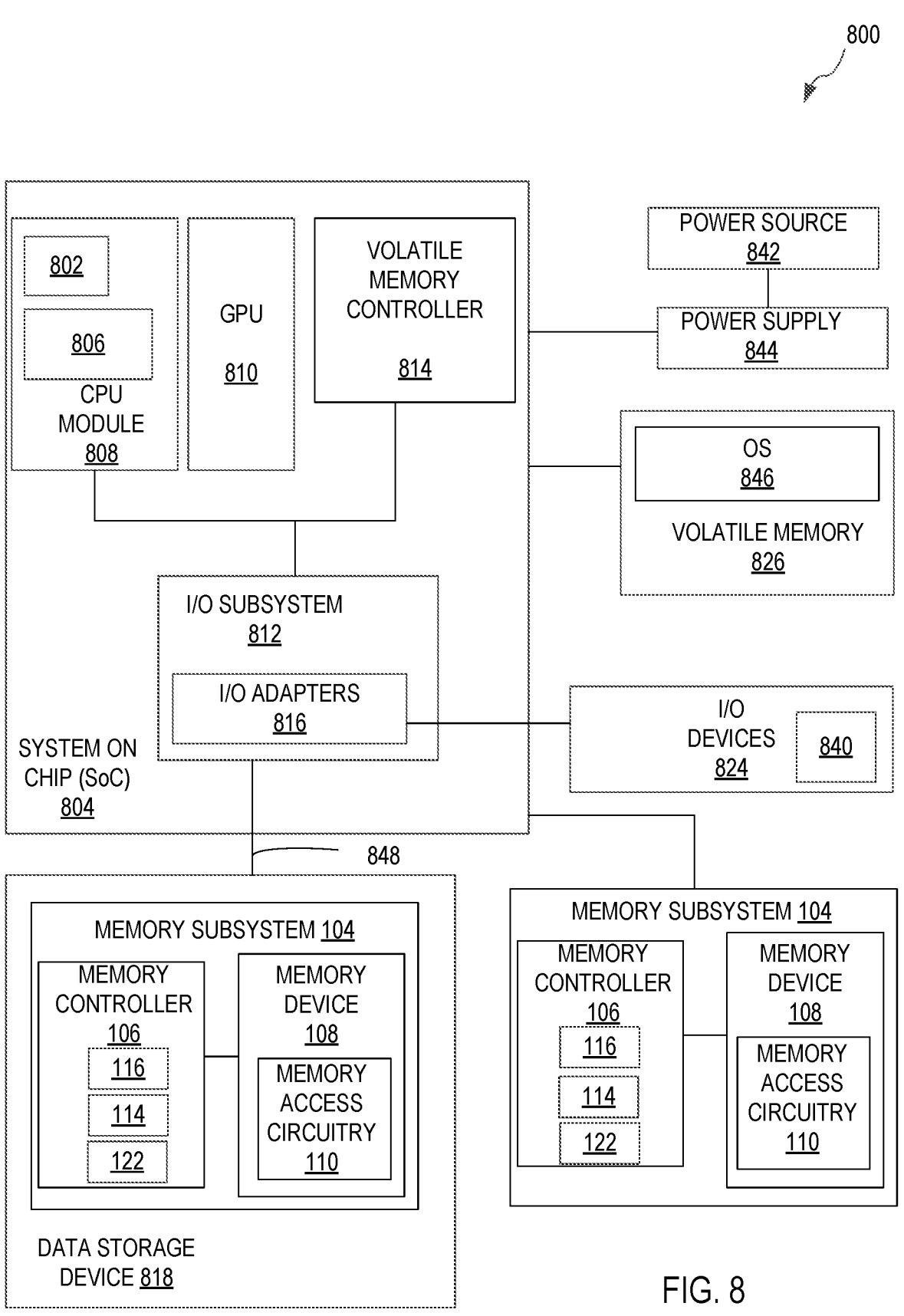
FIG. 8 is a block diagram of an embodiment of a computer system that includes a memory subsystem in which partition offsets for column read enabled memory improves media management performance of memory devices in accordance with various examples described herein.

FIG. 8 is a block diagram of an embodiment of a computer system 800 that includes the memory subsystem 104. Memory subsystem 104 includes memory device 108 and memory controller 106 that includes ECC circuitry 116, L2P address circuitry 114 and partition offset program circuitry 124. Computer system 800 can correspond to a computing device including, but not limited to, a server, a workstation computer, a desktop computer, a laptop computer, and/or a tablet computer.

The computer system 800 includes a system on chip (SOC or SoC) 804 which combines processor, graphics, memory, and Input/Output (I/O) control logic into one SoC package. The SoC 804 includes at least one Central Processing Unit (CPU) module 808, a volatile memory controller 814, and a Graphics Processor Unit (GPU) 810. In other embodiments, the volatile memory controller 814 can be external to the SoC 804. The CPU module 808 includes at least one processor core 802 and a level 2 (L2) cache 806.

Although not shown, each of the processor core(s) 802 can internally include one or more instruction/data caches, execution units, prefetch buffers, instruction queues, branch address calculation units, instruction decoders, floating point units, retirement units, etc. The CPU module 808 can correspond to a single core or a multi-core general purpose processor, such as those provided by Intel® Corporation, according to one embodiment.

The Graphics Processor Unit (GPU) 810 can include one or more GPU cores and a GPU cache which can store graphics related data for the GPU core. The GPU core can internally include one or more execution units and one or more instruction and data caches. Additionally, the Graphics Processor Unit (GPU) 810 can contain other graphics logic units that are not shown in FIG. 8, such as one or more vertex processing units, rasterization units, media processing units, and codecs.

Within the I/O subsystem 812, one or more I/O adapter(s) 816 are present to translate a host communication protocol utilized within the processor core(s) 802 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 816 can communicate with external I/O devices 824 which can include, for example, user interface device(s) including a display and/or a touch-screen display 840, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 816 can also communicate with a solid-state drive ("SSD") 818 which includes memory subsystem 104.

The I/O adapters 816 can include a Peripheral Component Interconnect Express (PCIe) adapter that is communicatively coupled using the NVMe (NVM Express) over PCIe (Peripheral Component Interconnect Express) protocol over bus 848 to the SSD 818. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Volatile memory 826 is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WI02 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications. The JEDEC standards are available at www.jedec.org.

The memory subsystem 104 includes a byte-addressable, write-in-place memory that can be accessed by rows or columns, for example, Intel 3D XPoint™ Other examples of byte-addressable, write-in-place memory include, but are not limited to, single or multi-level Phase Change Memory (PCM) or phase change memory with a switch (PCMS), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other types of byte-addressable, write-in-place memory.

An operating system 846 is software that manages computer hardware and software including memory allocation and access to I/O devices. Examples of operating systems include Microsoft® Windows®, Linux®, iOS® and Android®.

Power source 842 provides power to the components of system 800. More specifically, power source 842 typically interfaces to one or multiple power supplies 844 in system 800 to provide power to the components of system 800. In one example, power supply 844 includes an AC to DC (alternating current to direct current) adapter to plug into a wall outlet. Such AC power can be renewable energy (e.g., solar power) power source 842. In one example, power source 842 includes a DC power source, such as an external AC to DC converter. In one example, power source 842 or power supply 844 includes wireless charging hardware to charge via proximity to a charging field. In one example, power source 842 can include an internal battery or fuel cell source.

Figure 9:
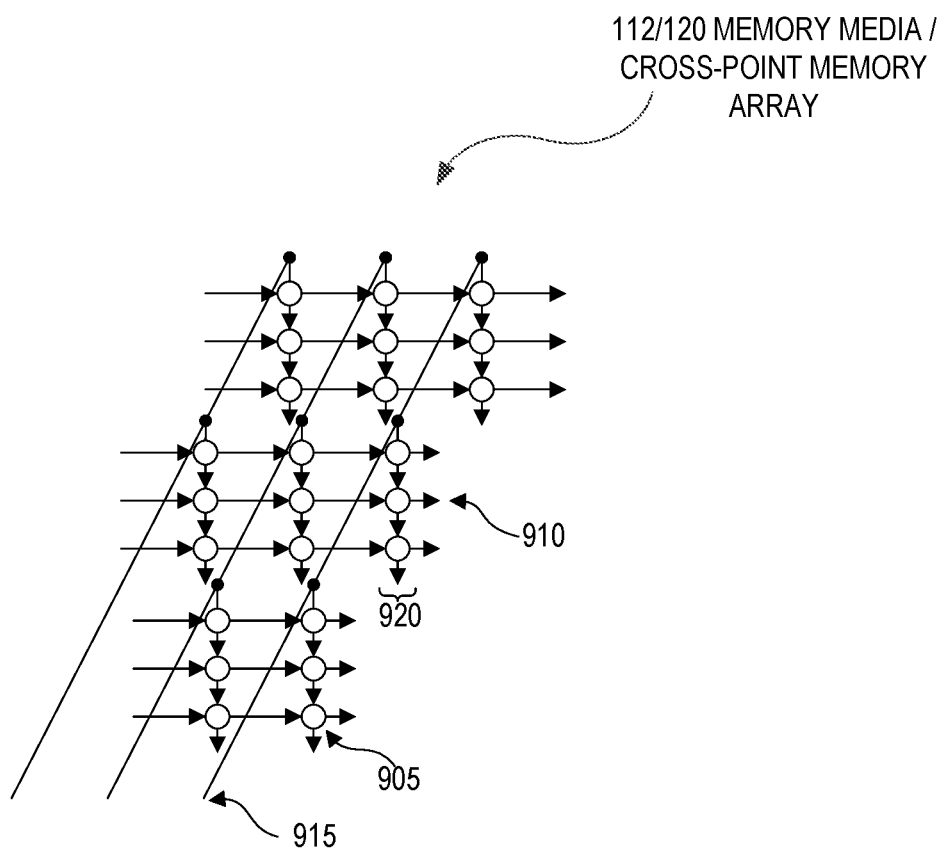
FIG. 9 is an example of a cross-point memory array as shown in FIG. 1 that includes a plurality of memory cells in accordance with various examples described herein.

FIG. 9 is an example of a cross-point memory array 900 (as referenced earlier in FIG. 1, 120) that includes a plurality of memory cells 905. The cross-point memory array 900 can be a byte-addressable, write-in-place memory, including a non-volatile memory. A non-volatile memory (NVM) device is a type of memory whose state is determinate even if power is interrupted to the device.

In an embodiment, each memory cell 905 includes a material with a crystalline or an amorphous atomic configuration that may have different electrical resistances. A voltage applied to the memory cell 905 results in a different current dependent on whether the material is in a crystalline or an amorphous state, and the magnitude of the resulting current may be used to determine the logic state stored by memory cell 905.

Cross-point memory array 900 may be a three dimensional cross-point memory (3D cross-point memory) array that includes a plurality of levels of two-dimensional (2D) memory arrays formed on top of one another and separated by an electrically insulating material. In the embodiment shown in FIG. 9, cross-point memory array 900 includes three levels; however, the number of levels is not limited to three. The electrically insulating material may be thermally insulating and may contain multiple sublayers to increase the thermal resistance between each level. Each level may be aligned or positioned so that memory cells 905 may be approximately aligned with one another across each level, forming a memory cell stack 920.

Each row of memory cells 905 is connected to a word line 910, and each column of memory cells 905 is connected to a bit line 915 with a memory cell 905 located at the intersection of a word line 910 and a bit line 915. In an embodiment, word lines 910 and bit lines 915 may be substantially perpendicular to one another to create an array.

The memory cells 905 can function in a two-terminal architecture with a particular word line 910 and bit line 915 serving as the electrodes for the memory cells 905. Each memory cell 905 can be addressed individually allowing data to be written and read on a per-bit basis. Word lines 910 and bit lines 915 may be made of conductive materials, such as metals (for example, copper, aluminum, gold, tungsten, titanium), metal alloys, carbon, or other conductive materials, alloys, or compounds.

In operation, a memory cell 905 of cross-point memory array 900 can be written by applying a voltage, across the memory cell 905 via a selected word line 910 and bit line 915. A memory cell 905 of the cross-point memory array 900 can be read by sensing current on a bit line 915 corresponding to the respective memory cell 905 responsive to a particular voltage applied to the selected word line 910 to which the respective memory cell is coupled.

The magnitude of the current sensed is dependent on the electrical resistance of the memory cell 905 and may be used to differentiate between the electrically resistive states of the phase change material. In some cases, sensing may depend on a threshold voltage Vth, a voltage at which point a current begins to flow.

The state of the memory cell 905 may be a low resistance crystalline state or a high resistance amorphous state, the state is used to represent whether the memory cell stores a logic (binary) '1' (a bit is "set") or logic (binary) '0' (a bit is "clear"). In an embodiment, the low resistance state represents a logic '0' and the high resistance state represents a logic '1'.

Process diagrams FIGS. 6-7 as illustrated herein provide examples of sequences of various process actions. The process diagrams can indicate processes, operations or actions to be executed by a software or firmware routine, as well as physical operations or actions. In one embodiment, a process diagram can illustrate the state of a finite state machine (FSM), which can be implemented in hardware and/or software. Although shown in a particular sequence or order, unless otherwise specified, the order of the processes, operations or actions can be modified. Thus, the illustrated embodiments should be understood as an example, and the processes, operations or actions can be performed in a different order or in parallel. Additionally, one or more processes, operations or actions can be omitted in various embodiments; thus, not all processes, operations or actions are required in every embodiment. Other sequences or orders of processes, operations or actions are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Additional example implementations are as follows:

Example 1 is a method, system, apparatus or computer-readable medium for optimized column read enabled memory comprising a cross-point memory array having memory cells arranged in physical rows and physical columns and circuitry to store an array of bits in the cross-point memory array, including circuitry to store each entry of a logical column of the array of bits in a different contiguous physical row and a different physical column of the cross-point memory array than any other entry of the logical column, and store a subset of contiguous physical rows in a single partition of multiple partitions of the memory.

Example 2 is the method, system, apparatus or computer-readable medium of Example 1 in which the circuitry to store each entry of the logical column of the array of bits in different contiguous physical rows and different physical columns is based on address offsets and the circuitry to store the subset of the contiguous physical rows in the single partition is based on combining the address offsets with partition offsets.

Example 3 is the method, system, apparatus or computer-readable medium of any of Examples 1 and 2 in which each entry of the logical column of the array of bits comprises a multi-bit entry including data bits and parity bits, and the address offsets are based at least in part on a number of bits comprising the multi-bit entry.

Example 4 is the method, system, apparatus or computer-readable medium of any of Examples 1, 2 and 3, in which the partition offsets are based on a number of entries in the logical column of the array of bits, including any of four partition offsets for four contiguous physical rows per partition and eight partition offsets for two contiguous physical rows per partition, for a total of sixteen entries in the logical column.

Example 5 is the method, system, apparatus or computer-readable medium of any of Examples 1, 2, 3 and 4 in which the circuitry is further to perform a column read of the logical column of the array of bits, including to combine an address offset and a partition offset to determine physical row addresses and physical column addresses of stored entries.

Example 6 is the method, system, apparatus or computer-readable medium of any of Examples 1, 2, 3, 4 and 5, in which the circuitry is further to refresh entries in the logical column of the array of bits, including to read the subset of the contiguous physical rows in the single partition in which the entries are stored and move the subset of the contiguous physical rows to another single partition different from any other partition in which contiguous physical rows are stored.

Example 7 is the method, system, apparatus or computer-readable medium of any of Examples 1, 2, 3, 4, 5 and 6, in which each entry of the logical column of the array of bits is stored diagonally across the different contiguous physical rows and different physical columns of the cross-point memory array to simplify mathematical operations for determining physical addresses based on the address offsets.

Example 8 is a method, system, apparatus or computer-readable medium of any of Examples 1, 2, 3, 4, 5, 6 and 7 further comprising a processor coupled to the memory and the circuitry.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A memory device comprising:
a memory array to have a plurality of memory cells maintained in a plurality of memory dies, the plurality of memory dies arranged such that each memory cell is addressable based on a physical row and a physical column address; and circuitry to:

map groups of two or more physical column addresses to separate multi-bit logical columns such that a respective multi-bit logical column is arranged so that each bit of data included in the respective multi-bit logical column is stored to a different physical row and physical column address of the memory array than any other bits of data included in the respective multi-bit logical column;

map an input partition component to a partition offset programmed to separate memory dies of the plurality of memory dies, the input partition mapped to the partition offset to determine a partition from among multiple partitions for the separate memory dies;

receive a system address having offset information that indicates the partition is to be accessed and also indicates which memory die from among the plurality of memory dies is to be accessed; and access data included in at least one multi-bit logical column from among the separate multi-bit logical columns based on the system address and the offset information.

2. The memory device of claim 1, wherein the data included in the at least one multi-bit logical column includes data bits and parity bits.

3. The memory device of claim 1, wherein the partition offset programmed to the separate memory dies is based on a number of bits of data included in the separate multi-bit logical columns, including any of four partition offsets for four contiguous physical row addresses per partition and eight partition offsets for two contiguous physical row addresses per partition, for a total of sixteen bits of data in the each multi-bit logical column.

4. The memory device of claim 1, wherein the circuitry is further to:

refresh bits of data included in the at least one multi-bit logical column, including to read physical row addresses in the partition in which the bits of data are stored; and move the bits of data stored in the physical row addresses to another single partition from among the multiple partitions that is different from any other partition in which the bits of data were stored in the physical row addresses.

5. The memory device of claim 1, wherein bits of data included in separate multi-bit logical columns are stored diagonally across different physical row and physical column addresses of the memory array are to simplify mathematical operations for determining physical addresses to access based on the offset information received with the system address.

6. A system comprising:

a processor; and a memory subsystem operatively connected to the processor, the memory subsystem to include:

a memory array to have a plurality of memory cells maintained in a plurality of memory dies, the plurality of memory dies arranged such that each memory cell is addressable based on a physical row and a physical column address; and circuitry to:

map groups of two or more physical column addresses to separate multi-bit logical columns such that a respective multi-bit logical column is arranged so that each bit of data included in the respective multi-bit logical column is stored to a different physical row and physical column address in the memory array than any other bit of data included in the respective multi-bit logical column;

map an input partition component to a partition offset programmed to separate memory dies of the plurality of memory dies, the input partition mapped to the partition offset to determine a partition from among multiple partitions for the separate memory dies;

receive a system address having offset information that indicates the partition is to be accessed and also indicates which memory die from among the plurality of memory dies is to be accessed; and access data included in at least one multi-bit logical column from among the separate multi-bit logical columns based on the system address and the offset information.

7. The system of claim 6, wherein the circuitry is further to:

refresh bits of data included in the at least one multi-bit logical column, including to read physical row addresses in the partition in which the bits of data are stored; and move the bits of data stored in the physical row addresses to another single partition from among the multiple partitions that is different from any other single partition in which the bits of data were stored in the physical row addresses.

8. The system of claim 6, wherein the multiple partitions for the separate memory dies are based on how many bits of data are included in the separate multi-bit logical columns and how many physical row and physical column addresses are included in the plurality of memory cells of the memory array, the multiple partitions including any of four partitions for four contiguous physical row addresses per partition and eight partitions for two contiguous physical row addresses per partition, for a total of sixteen bits of data included in the separate multi-bit logical columns.

9. The system of claim 6, wherein the data included in the at least one multi-bit logical column includes data bits and parity bits.

10. A method comprising:

partitioning a memory array into multiple partitions, the memory array having a plurality of memory cells maintained in a plurality of memory dies, the plurality of memory dies arranged such that each memory cell is addressable based on a physical row and a physical column address;

mapping groups of two or more physical column addresses to separate multi-bit logical columns such that a respective multi-bit logical column is arranged so that each bit of data included in the respective multi-bit logical column is stored to a different physical row and physical column address of the memory array than any other bit of data included in the respective multi-bit logical column;

mapping an input partition component to a partition offset programmed to separate memory dies of the plurality of memory dies, the input partition mapped to the partition offset to determine a partition from among multiple partitions for the separate memory dies;

receiving a system address having offset information that indicates the partition is to be accessed and also indicates which memory die from among the plurality of memory dies is to be accessed; and accessing data included in at least one multi-bit logical column from among the separate multi-bit logical columns based on the system address and the offset information.

11. The method of claim 10, further comprising:

refreshing bits of data included in the at least one multi-bit logical column, including to read physical row addresses in the partition in which the bits of data are stored; and moving the bits of data stored in the physical row addresses to another single partition from among the multiple partitions that is different from any other single partition in which the bits of data were stored in the physical row addresses.

12. The method of claim 10, wherein the multiple partitions for the separate memory dies are based on how many bits of data are included in the separate multi-bit logical columns and how many physical row and physical column addresses are included in the plurality of memory cells of the memory array, the multiple partitions including any of four partitions for four contiguous physical row addresses per partition and eight partitions for two contiguous physical row addresses per partition, for a total of sixteen bits of data included in the separate multi-bit logical columns.

13. The method of claim 10, wherein the data included in the at least one multi-bit logical column includes data bits and parity bits.

* * * * *